United States Patent [19]
Lin

[11] Patent Number: 6,071,656
[45] Date of Patent: Jun. 6, 2000

[54] PHOTOLITHOGRAPHY TECHNIQUE UTILIZING ALIGNMENT MARKS AT SCRIBE LINE INTERSECTIONS

[75] Inventor: Benjamin Szu-Min Lin, Chiayi City, Taiwan

[73] Assignee: United Microelectronics Corp., Taiwan

[21] Appl. No.: 09/349,209

[22] Filed: Jul. 7, 1999

[51] Int. Cl.[7] .................................................. G03F 9/00
[52] U.S. Cl. ........................................................ 430/22
[58] Field of Search .................................... 430/5, 22

[56] References Cited

U.S. PATENT DOCUMENTS

| | | | |
|---|---|---|---|
| 5,695,897 | 12/1997 | Mitome et al. | 430/22 |
| 5,837,404 | 11/1998 | Lu | 430/22 |
| 5,868,560 | 2/1999 | Tamada et al. | 430/22 |

*Primary Examiner*—Christopher G. Young
*Attorney, Agent, or Firm*—Martine Penilla & Kim, LLP

[57] ABSTRACT

A photolithography technique. A chip has latitudinal scribe lines and longitudinal scribe lines and also has a plurality of alignment marks. The latitudinal scribe lines and longitudinal scribe lines divide the chip into a plurality of dies. Some dies are effective dies. Alignment marks are located at each intersection of the latitudinal and longitudinal scribe lines. Each shot contains a plurality of dies. A mask having a plurality of mask alignment marks is provided. The mask alignment marks are used for alignment with alignment marks in the chip. The alignment marks of the chip are aligned with the mask alignment marks of the mask. At least three alignment marks close to the effective dies in the shots are selected for detection a focus and focal plane of each shot, so as to level the shot and perform an exposure step on each shot, shot by shot.

8 Claims, 6 Drawing Sheets

PHOTOLITHOGRAPHY TECHNIQUE UTILIZING ALIGNMENT MARKS AT SCRIBE LINE INTERSECTIONS

BACKGROUND OF THE INVENTION

1. Field of the Invention

The present invention relates to a photolithography exposure process. More particularly, the present invention relates to method for determining focus and leveling of a chip.

2. Description of the Related Art

Photolithography is one of the important technologies for fabricating integrated circuits. For example, patterns of a variety of semiconductor layers are defined by photolithography. Thus, photolithography is a critical factor when semiconductor devices are downsized.

In an exposure technique of a photolithography process, depth of focus (DOF) and leveling of a chip are the key parameters that determine whether or not the pattern can be precisely transferred. Thus, during an exposure process, both depth of focus and leveling of different shots in the chip need to be considered, so as to entirely and precisely transfer patterns onto a photoresist layer on the chip.

In FIG. 1, a chip 10 comprises latitudinal scribe lines 20 and longitudinal scribe lines 22. The latitudinal scribe lines 20 and the longitudinal scribe lines 22 divide the chip 10 into dies 24. Since an exposure process is performed by a step and repeat process, the chip 10 needs to be divided into shots 14 in accord with an exposure area that a stepper is able to expose every time. Before the exposure process, an alignment mark 12 of each shot 14 is aligned with a mask alignment mark on a mark. Sensors are used to detect a focus and determine a focal plane of each shot 14, shot by shot. Each shot is leveled with the data obtained from the sensors. The exposure process thus is performed, shot by shot.

During detection, the sensor detects shots 14 with fixed detection points, shot by shot. As shown in FIG. 1, the detection points X, Y, and Z determine the focal plane of the shot 14. The shots 14 are divided into whole fields 14a and wafer edge fields 14b, which also known as non-whole fields. Each whole field 14a includes dies 24 that are complete squares, whereas each wafer edge field 14b includes at least one die 24 that is not complete square. Since the whole field 14a comprises the detection points X, Y, and Z, the focal plane of the whole field 14a is effectively determined. However, it is difficult for all three detection points X, Y and Z to fall on some of the wafer edge fields 14b. Since all the detection points X, Y, Z cannot fall on some of the wafer edge fields 14b, the conventional method has difficulties in detecting the wafer edge fields 14b with detection points X, Y, and Z. Therefore, an approximate heterodyne algorithm is used to estimate the focal plane of the wafer edge fields 14b.

However, during the fabrication of the chip 10, stress is generated and accumulated in the chip 10. This, in turn, causes the chip 10 to warp and deform. Reference is made to FIG. 2, which illustrates the reverse side of the deformed chip 10. The gradients of the whole fields 14a and the wafer edge fields 14b are particularly different. For example, in order to determine a focal plane the wafer edge field 14b, two whole fields nearby are selected. The detected focal planes A and B obtained from the whole fields 14a are used in the heterodyne algorithm to estimate the focal plane of the wafer edge field 14b. The estimated focal plane of the wafer edge field 14b falls at the focal plane D. However, the estimated focal plane D is different from the actual focal plane C. Since the estimated focal plane D is different from the actual focal plane C, while focal plane D serves as the focal plane of the wafer edge field 14b, the focus and the leveling are not optimal. Thus, patterns of the mask cannot be precisely transfer onto the chip 10. The fabrication yield is reduced.

SUMMARY OF THE INVENTION

The invention provides a photolithography technique. A chip is provided. The chip comprises latitudinal scribe lines and longitudinal scribe lines and a plurality of alignment marks. The latitudinal scribe lines and longitudinal scribe lines divide the chip into a plurality of dies. The dies comprise effective dies. Each alignment mark is located at an intersection of each latitudinal scribe line and each longitudinal scribe line. Each shot comprises a plurality of dies. A mask comprising a plurality of mask alignment marks is provided. The mask alignment marks are used for alignment with alignment marks in the chip. The alignment marks of the chip are aligned with the mask alignment marks of the mask. At least three alignment marks close to the effective dies in the shots are selected for determining a focus and focal plane of each shot, so as to level the shot. An exposure process is performed on the shots.

The present invention also provides a photolithography technique. A chip is provided. The chip comprises a plurality of dies and a plurality of alignment marks. The dies comprise effective dies. The dies are framed by a plurality of scribe lines with the same width. Each alignment mark is near a corner of the effective dies. A mask comprising a plurality of mask alignment marks is provided. The mask alignment marks are used for alignment with alignment marks in the chip. The alignment marks of the chip are aligned with the mask alignment marks of the mask. At least three alignment marks are close to the effective dies in the shots ar(selected for determining a focus and focal plane of the shot, so as to level the shot. An exposure process is performed on the shots.

In the invention, the dies may also comprise ineffective dies. Preferably, the alignment marks are selected from the alignment marks that satisfactorily represent focal planes of the effective dies. The three alignment marks are preferably selected from the alignment marks that enclose a largest number of the effective dies.

In the present invention, any three alignment marks close to effective dies in each shot are selected for detection. Thus, the focus and the focal plane of each shot are effectively determined. In addition, when each shot is detected, detection points close to the effective die are selected without considering detection points near the ineffective dies. Thus, the present invention prevents the error caused by the ineffective dies. Patterns of the mask are precisely transformed onto a photoresist layer of the chip. The fabrication yield thus is increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
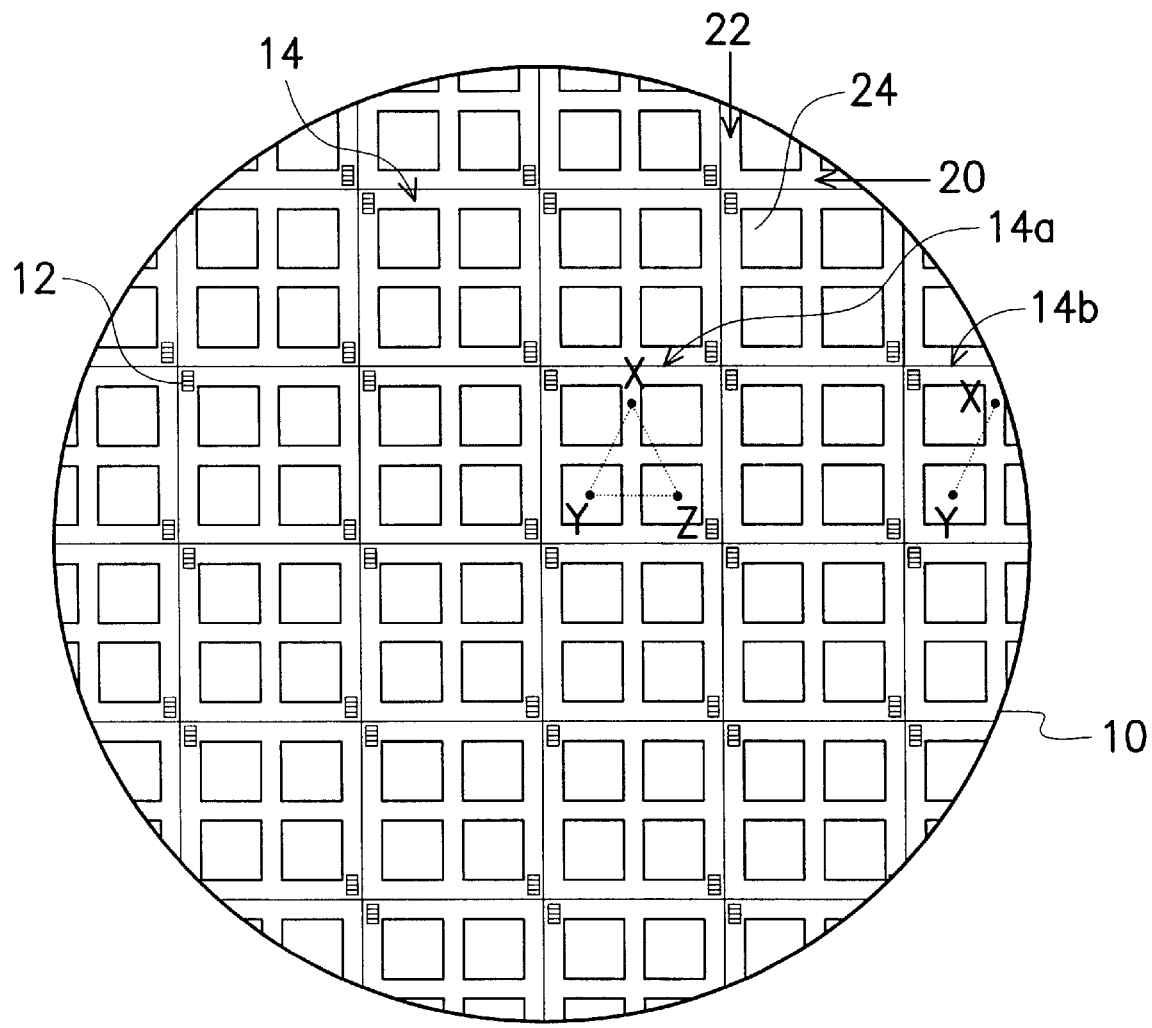
FIG. 1 is a schematic, top view of a chip according to the prior art.
Figure 2:
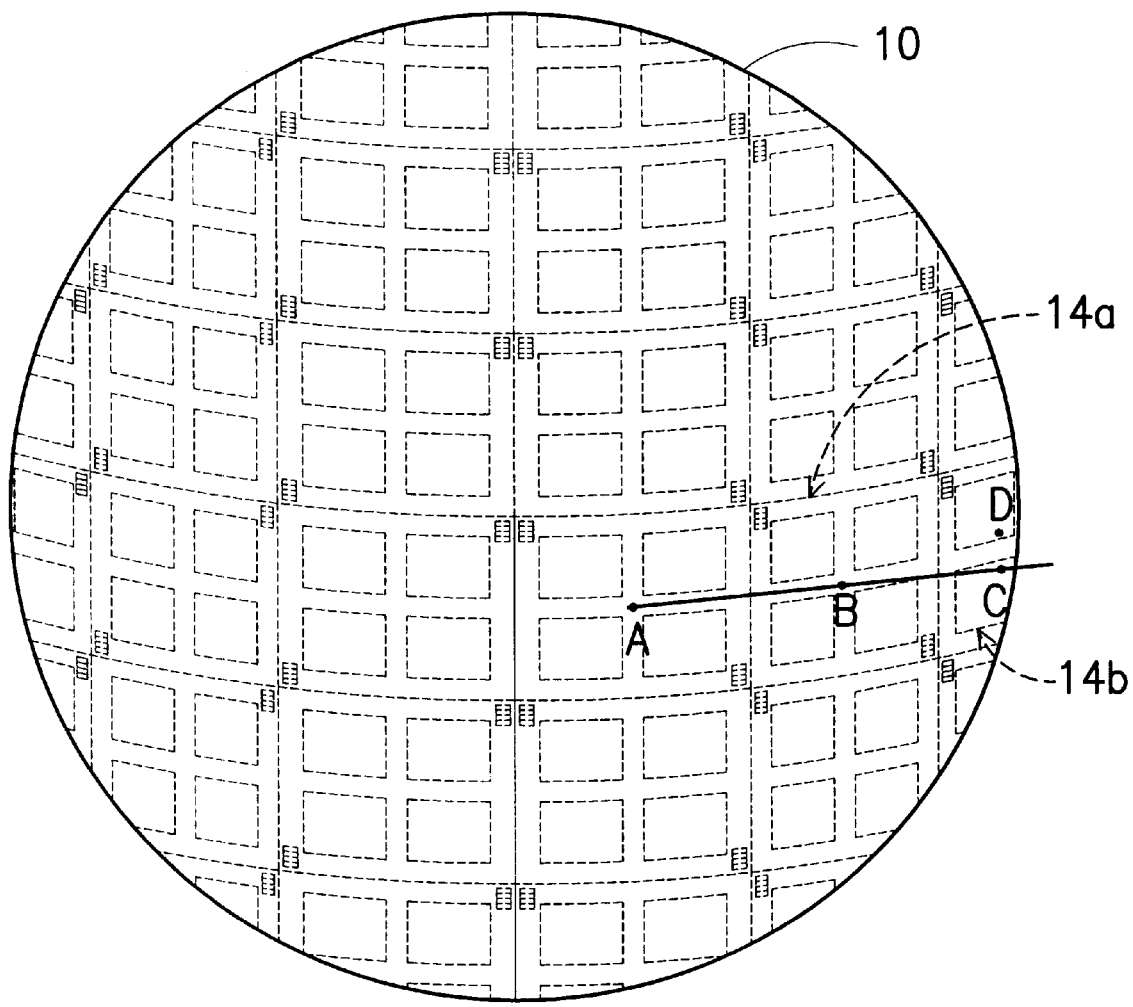
FIG. 2 is a schematic, cross-sectional view illustrating a reverse side of a deformed chip according to the prior art.

Reference will now be made in detail to the present preferred embodiments of the invention, examples of which are illustrated in the accompanying drawings. Wherever possible, the same reference numbers are used in the drawings and the description to refer to the same or like parts.

Figure 3:
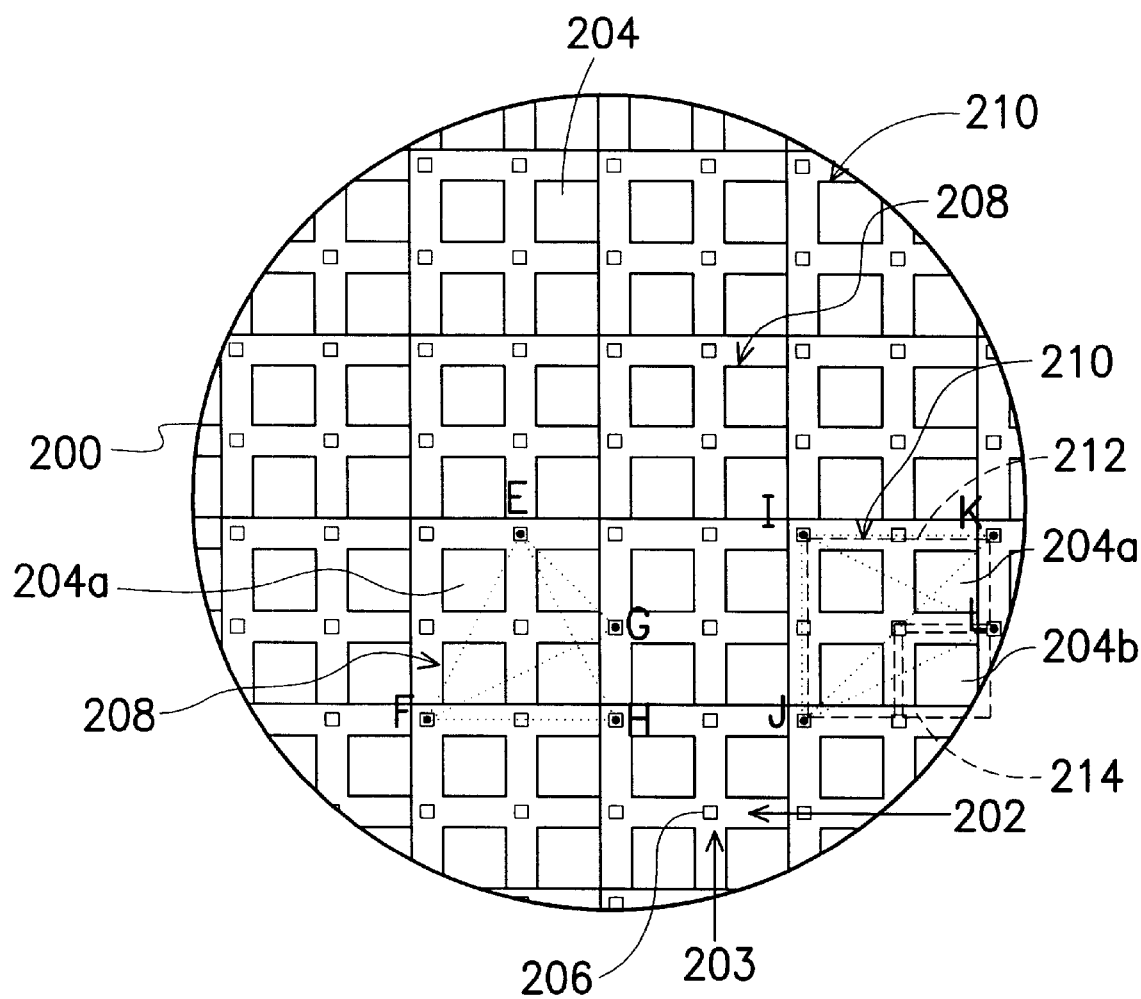
FIG. 3 is a schematic, top view of a chip according to one preferred embodiment of the invention.

In FIG. 3, a chip 200 comprises latitudinal scribe lines 202 and longitudinal scribe lines 203. The latitudinal scribe lines 202 and longitudinal scribe lines 203 divided the chip 200 into dies 204. An alignment mark 206 is located at the intersection between each latitudinal scribe line 202 and each longitudinal scribe line 203. That is, each corner of the die 204 has an alignment mark 206 nearby.

Since current exposure technique for the semiconductor fabrication process is performed by a step and repeat process, patterns of the mask 300 are transferred onto the chip 200, shot by shot. Thus, in accord with a design rule of semiconductor circuits and the exposure area that a stepper is able to expose every time, the chip 200 is divided into dies 208 and dies 210.

Each shot 208 represents a whole field of the chip 200. The shot 208 comprises effective dies 204a. Specifically, the dies 204a in the shot 208 are complete squares. A complete alignment mark 206 is located at the intersection between each latitudinal scribe line 202 and each longitudinal scribe line 203. The preferred embodiment takes the shot 208 having four dies 204a therein as an example. However, in practice, the number of the dies 204a in each shot 208 is determined in accord with the exposure area that a stepper can expose every time and the design of integrated circuits.

Each shot 210 represents a wafer edge field of the chip 200. Some of the dies 204 in the exposure regions 210 are effective dies 204a while other dies 204 in the exposure regions 210 are ineffective dies 204b. As shown in FIG. 3, the dies 204 enclosed by a perimeter 212 are effective dies 204a with four corners. However, the dies 204 enclosed by a perimeter 214 are ineffective dies 204b that do not have all four corners. That is, the number of the effective dies 204a in each shot 210 is less than 4. Additionally, there are fewer than four complete alignment marks.

Figure 4:
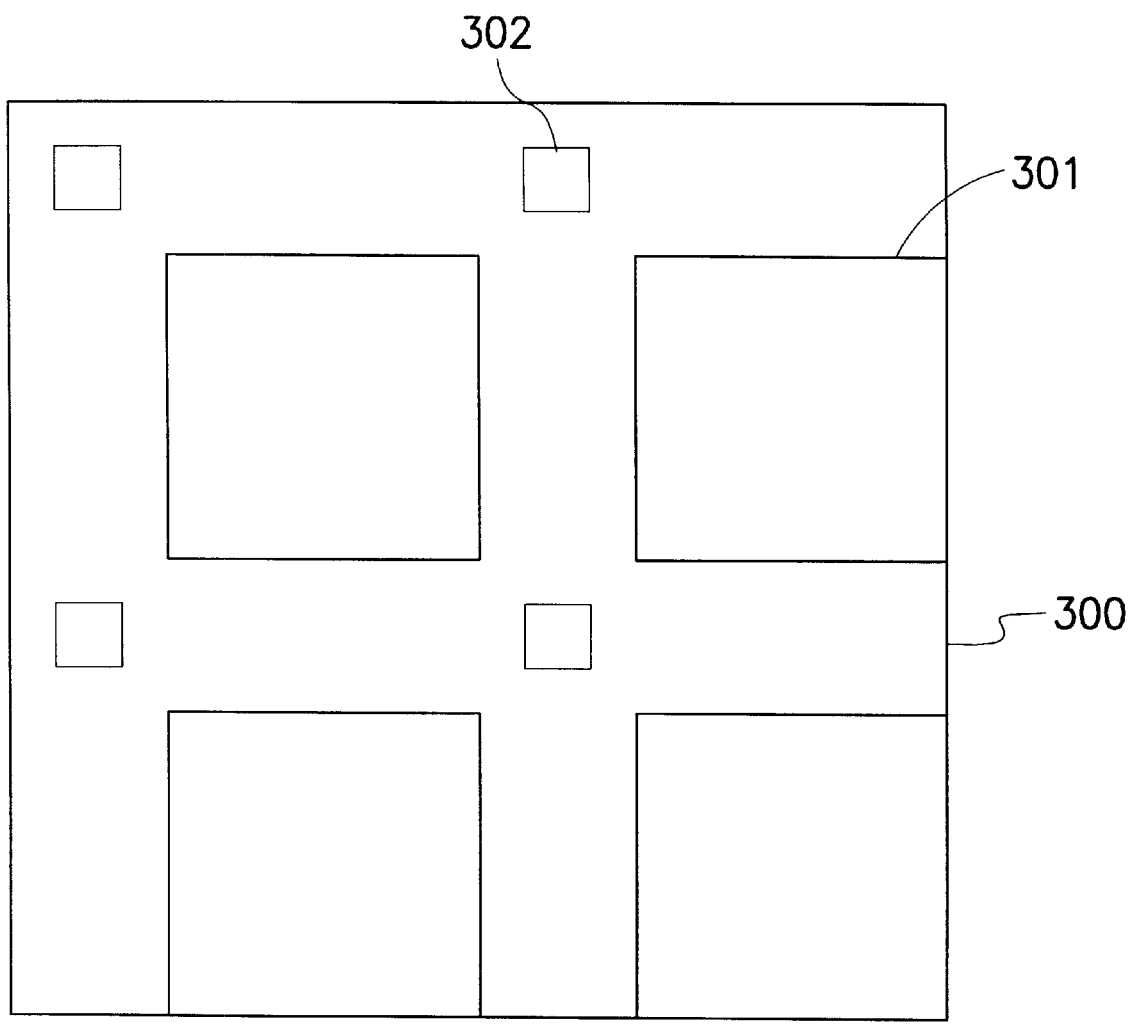
FIG. 4 is a schematic, top view of a mask according to one preferred embodiment of the invention.

In FIG. 4, a mask 300 comprises patterns 301 and mask alignment marks 302. The mask alignment masks 302 of the marks 300 are used for alignment with the alignment mark 206 of the chip 200 (shown in FIG. 3).

Before the exposure process, the alignment marks 206 in the shots 208 or in the shots 210 (shown in FIG. 3) are aligned with the mask alignment marks 302 of the mask 300. Then, the focus and the focal plane are detected.

Since any three points can determine a focal plane, when the focus and the focal plane of each shot 208 or each shot 210 are detected, at least any three alignment marks 206 near the effective dies 204a in the shot 208 or the shot 210 are selected to serve as detection points. The focal planes for the shots 208 or shots 210 thus are determined. The preferred detection points are selected from the points that can satisfactorily represent the actual shots 208 and the shots 210. For example, the detection points can be the three alignment marks 206 that include the largest number of the, effective dies 204a.

The following description takes the shot 208 in the chip 200 (shown in FIG. 3) as an example. When the focus and focal plane are detected, at least any three alignment marks 206 near the corner of the dies 204a in the shot 208 are selected. For example, the points E, F, and G or the points E, F, and H are selected for detection. However, since the points E, F, and G encloses a larger area, the points E, F, and G represent a largest number of effective dies 204a better than the points E, F, and H. Thus, the points E, F, and G are preferable. The detected focal plane is almost the same as the actual focal plane of the shot 208.

However, in the shot 210, also called wafer edge field 210, some of the dies 204 in the shot 210 are effective dies 204a while the other dies 204 are ineffective dies 204b, as shown in FIG. 3. Since the ineffective dies 204b cannot be manufactured into products, while selecting detection points, only the alignment marks 206 near the corner of the dies 204 enclosed by the perimeter line 212 are selected. For example, when the focus and the focal plane of the shot 210 are detected, points I, J, and K, or points I, J, and L, are selected for detection. The dies 204 enclosed by the points I, J, and K are effective dies 204a while the points I, J, and L enclose an ineffective die 204b. Thus, if the points of I, J, and L are selected to estimate the preferred focus and the preferred focal plane of the shot 210, the estimated focus and focal plane are different from the actual focus and the focal plane of the shot 210. However, if the points of I, J, and K are selected to estimate the focal plane and the focus of the exposure region 210, since the dies enclosed by the points I, J, and K are all effective dies 204a, the actual focal plane can be determined quite well. Thus, patterns of the mask 300 are precisely transferred onto a photoresist layer of the chip 200.

After the focus and the focal plane are detected, the preferred chip 200 position for exposure is adjusted to have a optimum depth of focus according to the detection results of each shot 208 or each shot 210. In addition, the shots 208 or the shots 210 are leveled. An exposure process is performed. The patterns of the mask 300 are transferred onto each shot 208 or each shot 210.

Figure 5:
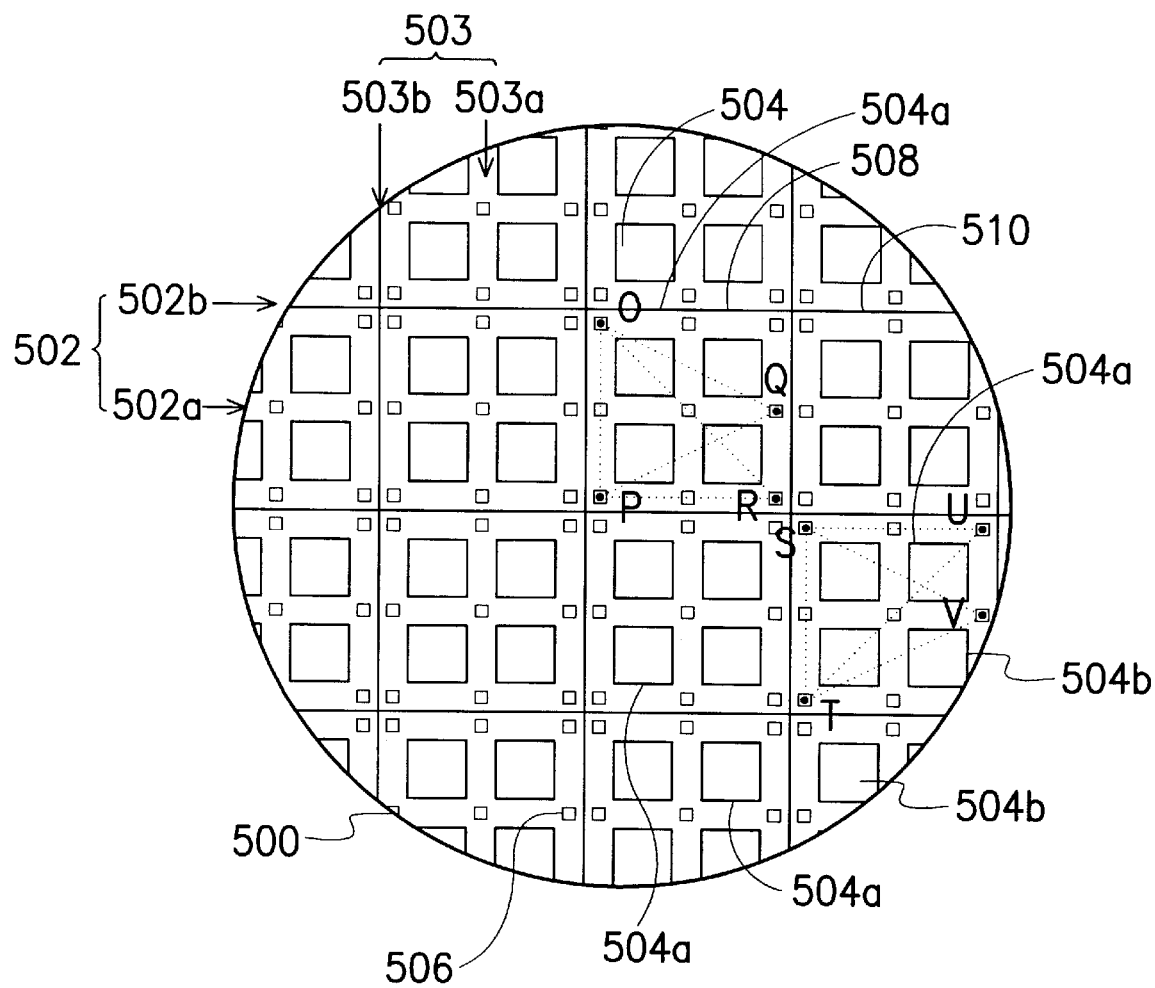
FIG. 5 is a schematic, top view of a chip according to another preferred embodiment of the invention.
Figure 6:
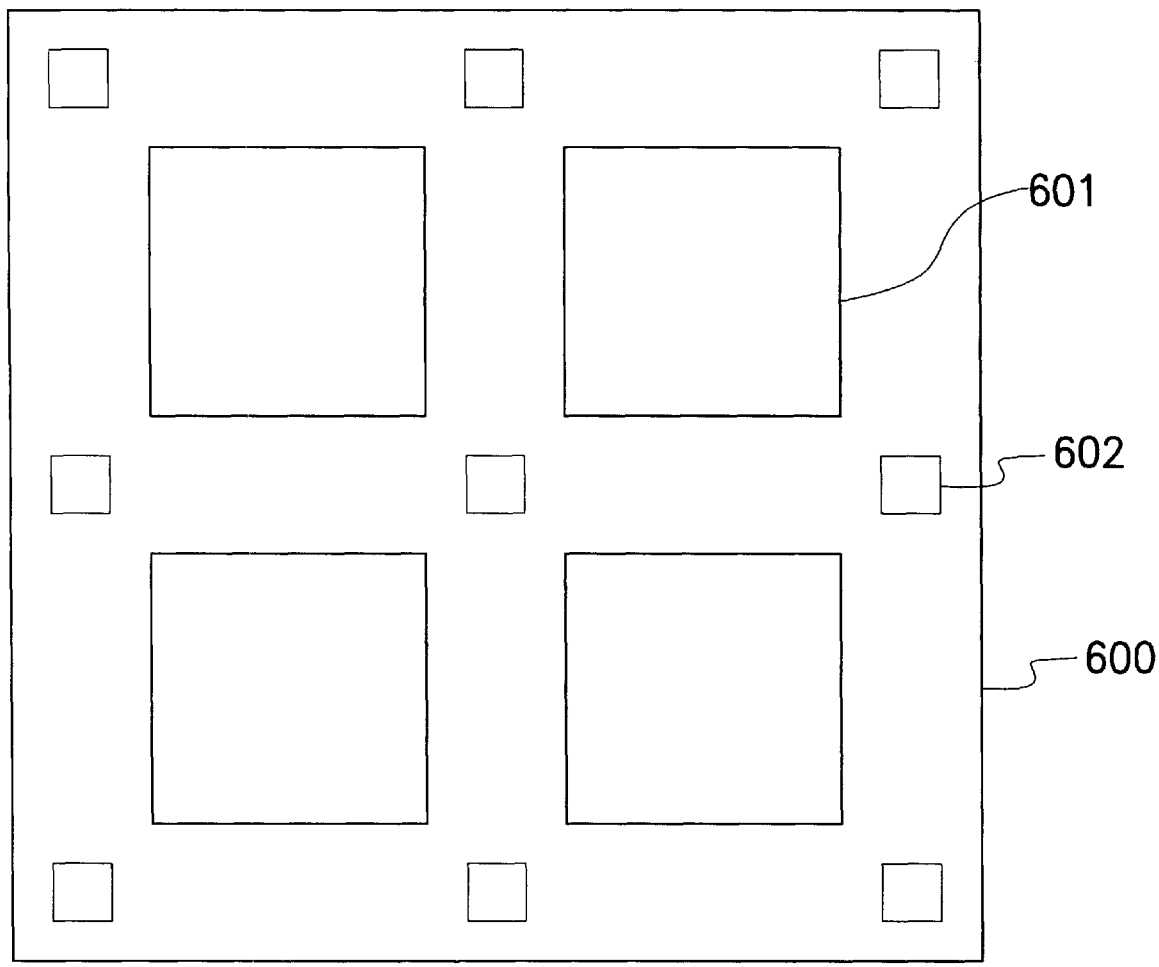
FIG. 6 is a schematic, top view of a mask according to another preferred embodiment of the invention.

Reference is made to FIGS. 5 and 6, which explain another preferred embodiment of the invention.

In FIG. 5, a chip 500 comprises latitudinal scribe lines 502 and longitudinal scribe lines 503. The latitudinal scribe lines 502 and longitudinal scribe lines 503 divide the chip 500 into dies 504. The latitudinal scribe lines 502 comprise single latitudinal scribe lines 502a and double latitudinal scribe lines 502b. The latitudinal scribe lines 502 alternately are single latitudinal scribe lines 502a and double latitudinal scribe lines 502b. The longitudinal scribe lines 503 comprise single longitudinal scribe lines 503a and double longitudinal scribe lines 503b. The longitudinal scribe lines 503 alternately are the single longitudinal scribe lines 503a and the double longitudinal scribe lines 503b. Conventionally, test keys are positioned on the double latitudinal scribe lines 502b and the double longitudinal scribe lines 503b.

In accord with the exposure area that a stepper is able to expose every time and integrated circuit design, the chip 500 is divided into shots 508 and shots 510. The double latitudinal scribe lines 502b and the double longitudinal scribe lines 503b are divided into single scribe linewidths, so as to divide the chip 500 into shots 508 and shots 510.

The shots 508 represent whole fields in the chip 500. Dies 504 in each shot 508 are effective dies 504a. Each die 504a is framed by the latitudinal line 502 and the longitudinal line 503 having the same width as the latitudinal line 502. A complete alignment mark 506 is located in the scribe line near the corner of each die 504. The preferred embodiment takes four effective dies 504a as the shot 508, for example. Thus, the shot 508 includes nine alignment marks 506. However, in practice, the number of dies 504 is decided according to the semiconductor circuit design and the exposure area that a stepper is able to expose every time.

The shots 510 represent the wafer edge fields in the chip 500. Some of the shots 510 are effective dies 504a while the other shots 510 are ineffective dies 504b. Thus, the number of the effective dies 504a in each shot 510 is less than four. That is, there are fewer than nine alignment markers 506.

In FIG. 4, the mask 600 includes patterns 601 that are desired to be transformed and the mask alignment marks 602. The mask alignment marks 602 are used for alignment with the alignment marks 506 in the chip 500.

Before the exposure process, the alignment marks 506 in the shots 508 or in the shots 510 are aligned with the mask alignment marks 602 in the mask 500. The focus and the focal plane of the shots 508 are detected.

Since any three points can determine a focal plane, when the focus and the focal plane of each shot 508 or each shot 510 are determined, at least any three alignment marks 506 close to the effective dies 504a in the shot 508 or the shot 510 are selected to serve as detection points. The shots 508 or shots 510 are leveled, shot by shot, so as to perform the exposure process. The preferred detection points are selected from the points that can satisfactorily represent the actual shots 508 and the shots 510. Preferably, the detection points can be three alignment marks 506 that enclose the largest number of the effective dies 504a.

The following description takes one shot 508 in the chip 500 as an example. Since the focus and focal plane are detected, at least any three alignment marks 506 near the dies 504a in the shot 508 are selected. For example, the points O, P, and Q or the points O, P, and R are selected for detection. However, since the points O, P, and Q enclose a larger area than the points Q, P, and R, the points O, P, and Q, represent the effective dies 204a better than the points O, P, and R. Thus, the points O, P, and Q are preferable. The detected focal plane of the shot 508 is almost the same as the actual focal plane of the shot 508.

However, in the shot 510, also called the wafer edge field 510, some of the dies 504 in the shot 510 are effective dies 504a while the other dies 504 are ineffective dies 504b, as shown in FIG. 3. Since the ineffective dies 504b cannot be manufactured into products, when selecting detection points, only the alignment marks 506 close to the corner of the effective dies 504a are selected. For example, while the focus and the leveling of the shot 510 are detected, points S, T, and U, or points S, T, and V are selected for detection. Since the points S, T, and U more satisfactorily represent the effective chip 504a, patterns of the mask 600 can be precisely transferred onto a photoresist layer of the chip 500.

After the focus and the focal plane are detected, each shot 508 or each shot 510 is leveled according to the detection value of each shot 508 or each shot 510. An exposure process is performed. The patterns of the mask 600 are transferred onto each shot 508 or each shot 510.

In the present invention, any three alignment marks close to effective dies in a shot are selected for detection. Thus, both whole fields and wafer (edge fields are effectively detected. The focus and the focal plane of each shot are effectively determined, as well.

In addition, when each shot is detected, detection points close to the effective die are selected without considering detection points near the ineffective dies. Thus, the present invention prevents the error caused by the ineffective dies.

The present invention effectively detects the focal plane of the wafer edge fields in the chip. The preferred focus and the focal plane are determined. Patterns of the mask are precisely transferred onto a photoresist layer of the chip. The fabrication yield thus is increased.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A photolithography technique, comprising:

providing a chip, wherein the chip comprises a plurality of latitudinal scribe lines, a plurality of longitudinal scribe lines, and a plurality of chip alignment marks at intersections of the latitudinal scribe lines and the longitudinal scribe lines, wherein the latitudinal scribe lines and the longitudinal scribe lines divide the chip into a plurality of effective and non-effective dies, and the chip further comprises a plurality of shots;

providing a mask comprising a plurality of mask alignment marks corresponding to chip alignment marks of the chip;

aligning the chip alignment marks of the chip with the mask alignment marks of the mask;

selecting at least three of the chip alignment marks close to the effective dies in the shots to detect a focus and determine a focal plane of each shot to level each shot; and performing an exposure process on the shots.

2. The technique of claim 1, wherein the dies comprise non-effective dies.

3. The technique of claim 1, wherein the alignment marks are selected from the alignment marks that satisfactorily represent focal planes of the effective dies.

4. The technique of claim 3, wherein the three alignment marks are selected from the alignment marks that enclose a largest number of the effective dies.

5. A photolithography technique, comprising:

providing a chip, the chip comprising a plurality of dies divided by a plurality of longitudinal scribe lines and a plurality of latitudinal scribe lines and a plurality of chip alignment marks at intersections of the longitudinal and the latitudinal scribe lines, wherein the dies comprise effective dies and non-effective dies and the chip are further divided into a plurality of shots;

providing a mask comprising a plurality of mask alignment marks in accordance with the chip alignment marks; and aligning the chip alignment marks with the mask alignment marks of the mask; and selecting at least three alignment marks close to the effective dies in the shots to detect a focus and determine a focal plane of each shot, wherein after a focal plane of each shot is determined, the shot is leveled to perform an exposure process, shot by shot.

6. The technique of claim 5, wherein the dies comprise effective dies and non-effective dies.

7. The technique of claim 5, wherein the alignment marks are selected from the alignment marks that satisfactorily represent focal planes of the effective dies.

8. The technique of claim 7, wherein three alignment marks are selected from the alignment marks that enclose a largest number of the effective dies.

* * * * *